United States Patent
Qualters et al.

(10) Patent No.: US 10,959,348 B1
(45) Date of Patent: Mar. 23, 2021

(54) SEISMIC BRACES FOR USE WITH COMPUTER RACKS

(71) Applicant: ZT Group Int'l, Inc., Secaucus, NJ (US)

(72) Inventors: Kevin R. Qualters, North Haledon, NJ (US); Christopher A. Gutierrez, Hackensack, NJ (US); Wojciech M. Serafin, Garfield, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 16/203,420

(22) Filed: Nov. 28, 2018

(51) Int. Cl.
*H05K 7/18* (2006.01)
*H05K 5/02* (2006.01)

(52) U.S. Cl.
CPC ........... *H05K 7/183* (2013.01); *H05K 5/0204* (2013.01); *H05K 5/0221* (2013.01); *H05K 5/0226* (2013.01)

(58) Field of Classification Search
CPC .... H05K 7/183; H05K 5/0204; H05K 5/0221; H05K 5/0226; H05K 5/0217; H05K 5/0239; E05Y 2900/0208; E05Y 2900/21; E05Y 2900/20; E05C 9/025; E05C 9/042; E05C 9/14; E05C 2009/1866; E05C 9/02; E05C 9/22; E05C 9/006; E05C 9/008; E05C 9/028; E05B 65/02; E05B 65/025; B65D 2251/1058; Y10T 292/08; Y10T 292/0801; Y10T 292/0807; Y10T 292/0834; Y10T 292/0836; Y10T 292/0837; Y10T 292/0838; Y10T 292/0839; Y10T 292/084; Y10T 292/0844; Y10T 292/0846; Y10T 292/0921; Y10T 292/0923; Y10T 292/0925; Y10T 292/0961; Y10T 292/0962; Y10T 292/0963; Y10T 292/0964; Y10T 292/0967; Y10T 292/0968

See application file for complete search history.

(56) References Cited

U.S. PATENT DOCUMENTS

| | | | | |
|---|---|---|---|---|
| 5,503,440 A * | 4/1996 | Peccoux | ............. | E05B 47/0603 292/158 |
| 6,425,488 B1 * | 7/2002 | Notohardjono | ...... | H05K 7/1495 211/182 |
| 7,425,026 B1 * | 9/2008 | Henderson | .......... | E05B 15/0205 292/302 |
| 8,733,853 B2 * | 5/2014 | Gingrich | .............. | H02B 13/025 312/216 |
| 10,356,935 B2 * | 7/2019 | Segroves | ............. | H05K 7/1495 |
| 2001/0036399 A1 * | 11/2001 | Notohardjono | .......... | H02B 1/54 414/800 |
| 2005/0016073 A1 * | 1/2005 | Petta | ....................... | E05F 11/24 49/504 |
| 2015/0282349 A1 * | 10/2015 | Mann | ....................... | E05C 1/06 312/283 |
| 2016/0177603 A1 * | 6/2016 | Sims | ....................... | E05C 9/063 292/101 |

* cited by examiner

*Primary Examiner* — Christopher Garft
(74) *Attorney, Agent, or Firm* — Dergosits & Noah LLP; Todd A. Noah

(57) ABSTRACT

An apparatus for bracing a face of a computer rack includes a brace mountable by hinges to one side of the face of the computer rack. A latch is mountable to the other side of the face of the computer rack. When the brace is closed against the face of the rack, the latch may be closed to capture elements of the brace and thereby provide rigidity to the face of the computer rack.

15 Claims, 17 Drawing Sheets

10,959,348 B1

SEISMIC BRACES FOR USE WITH COMPUTER RACKS

BACKGROUND

Due to geographical locations and data center requirements, many computer racks and other racks for electronic devices must meet seismic requirements. Developing "earthquake hardened" racks to satisfy the seismic requirements increases base product costs and supply chain logistic complexities. Furthermore, replacing an existing rack with a seismic requirement-compliant rack incurs the expense of a complete rack.

Thus, there exists the need for structures that may be added to existing computer racks to make them compliant with seismic requirements.

BRIEF DESCRIPTION OF THE DRAWINGS

The embodiments are illustrated by way of example and not limitation in the figures of the accompanying drawings, in which like references indicate similar elements, and in which.

DETAILED DESCRIPTION

Embodiments described within provide seismic braces that may be mounted to a base rack, e.g., a computer rack, to bring the base rack into compliance with applicable earthquake requirements. Embodiments include two basic structures: seismic braces and anchor brackets. One or more of the embodiments may be appropriate for a given base rack, depending on the devices held by the base rack and the configurations and service access requirements of those devices.

In embodiments, a seismic brace may be mounted to the front, rear, or both front and rear of a base rack. The purpose of a seismic brace is to increase the strength and stiffness of the base rack, and thereby reduce the flexing and relative motion of the rack during a seismic event. Embodiments of seismic braces are illustrated in FIGS. 1-13 and 16-18B. As the side of a base rack is typically more substantial due to the reduced need to access the side of a server or computer, the side of a base rack is typically not in need of bracing. However, embodiments may be added to sides of base racks as well.

In embodiments, an anchor bracket may be used to secure a rack to another structure, e.g., the floor of a data center. The purpose of the anchor bracket is to insure that the rack is robustly secured to the building and thereby reduce the potential for the rack to topple during a seismic event. Embodiments of anchor brackets are illustrated in FIGS. 2, 6, 14-16, 18A, and 18B.

Figure 1:
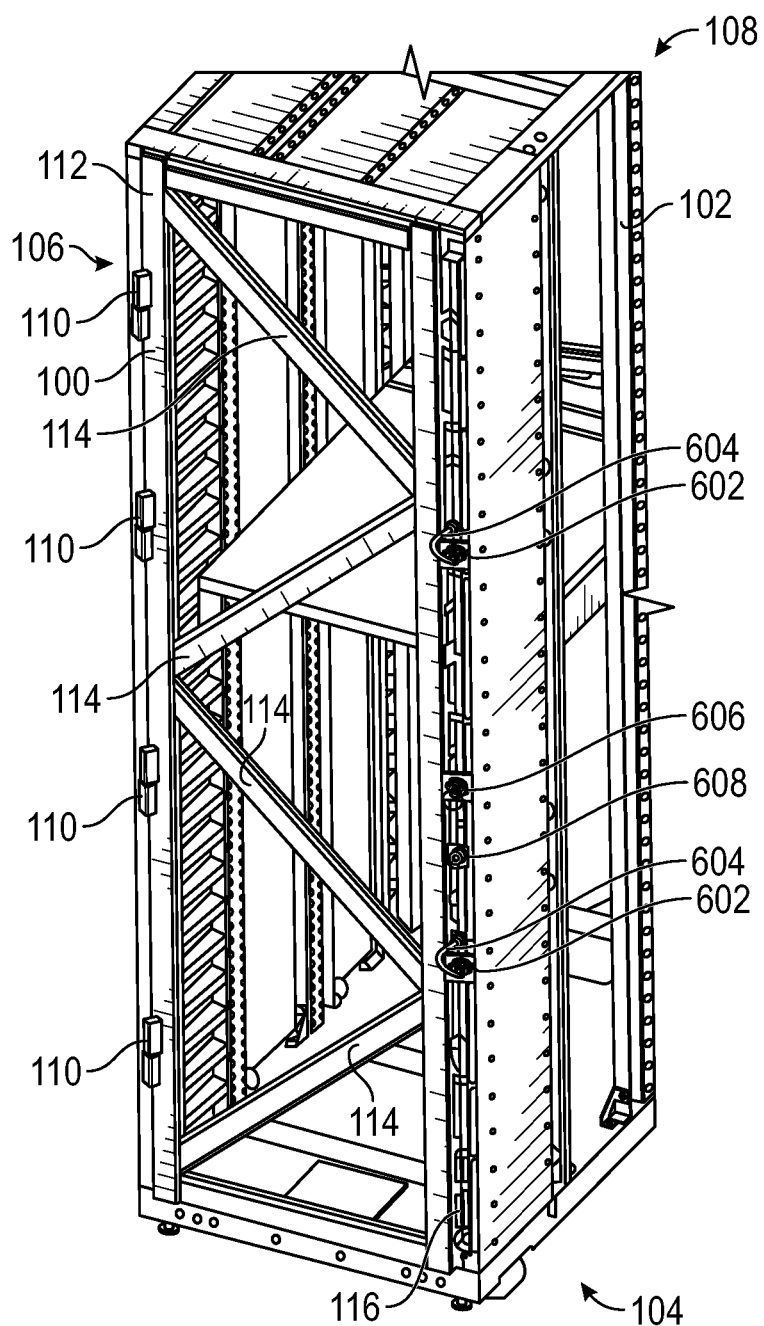
FIG. 1 is a perspective view illustrating an embodiment of a seismic brace mounted to the front of a computer rack.

FIG. 1 is a perspective view illustrating an embodiment of a seismic brace 100 mounted to the front of a computer rack 102. In FIG. 1, seismic brace 100 is mounted to the left side of a front face 106 of computer rack 102 with hinges 110. Seismic brace 100 includes a rectangular frame 112, which follows the rectangular face of computer rack 102. Frame 112 includes individual braces 114, which enhance the structural rigidity of frame 112. On the right side, opposite hinges 110, brace 100 includes a latch 116, which connects brace 100 to the right side of front face 106 of computer rack 102. Latch 116, when closed, captures or interlocks with elements extending from frame 112. As a result, when closed, seismic brace 100 effectively joins the left and right sides of the face of computer rack 102, resisting relative movement between them and increasing the strength and stiffness of rack 102. As one can see, the side of rack 102 is more substantial that front face 106 and may not need additional bracing itself. For future reference, computer rack 102 is shown to be supported by a floor 104 and to have a rear face 108.

In the embodiment of FIG. 1, on the left side, seismic brace 100 includes a frame element (a hinge plate 304, FIG. 3) for securing brace 100 to the rack and for further stiffening the left side of front face 106. This frame element is connected by a series of bolts to the left face of rack 102. Hinges 110 are connected directly to frame element 304.

In FIG. 1, frame 112 and individual braces 114 create a cross-brace structure. Should access to computers behind the cross-brace structure be needed, e.g., for computers needing to be regularly accessed for service and maintenance, the embodiment of FIG. 1 is convenient, since latch 116 may be opened and the right side swung out, pivoting on hinges 110. In the embodiment, latch 116 may be fixed in the closed position to prevent it from opening during a seismic event, and may be held in an open position to facilitate opening frame 112. The embodiment of FIG. 1 is further illustrated in FIGS. 2-13.

Figure 2:
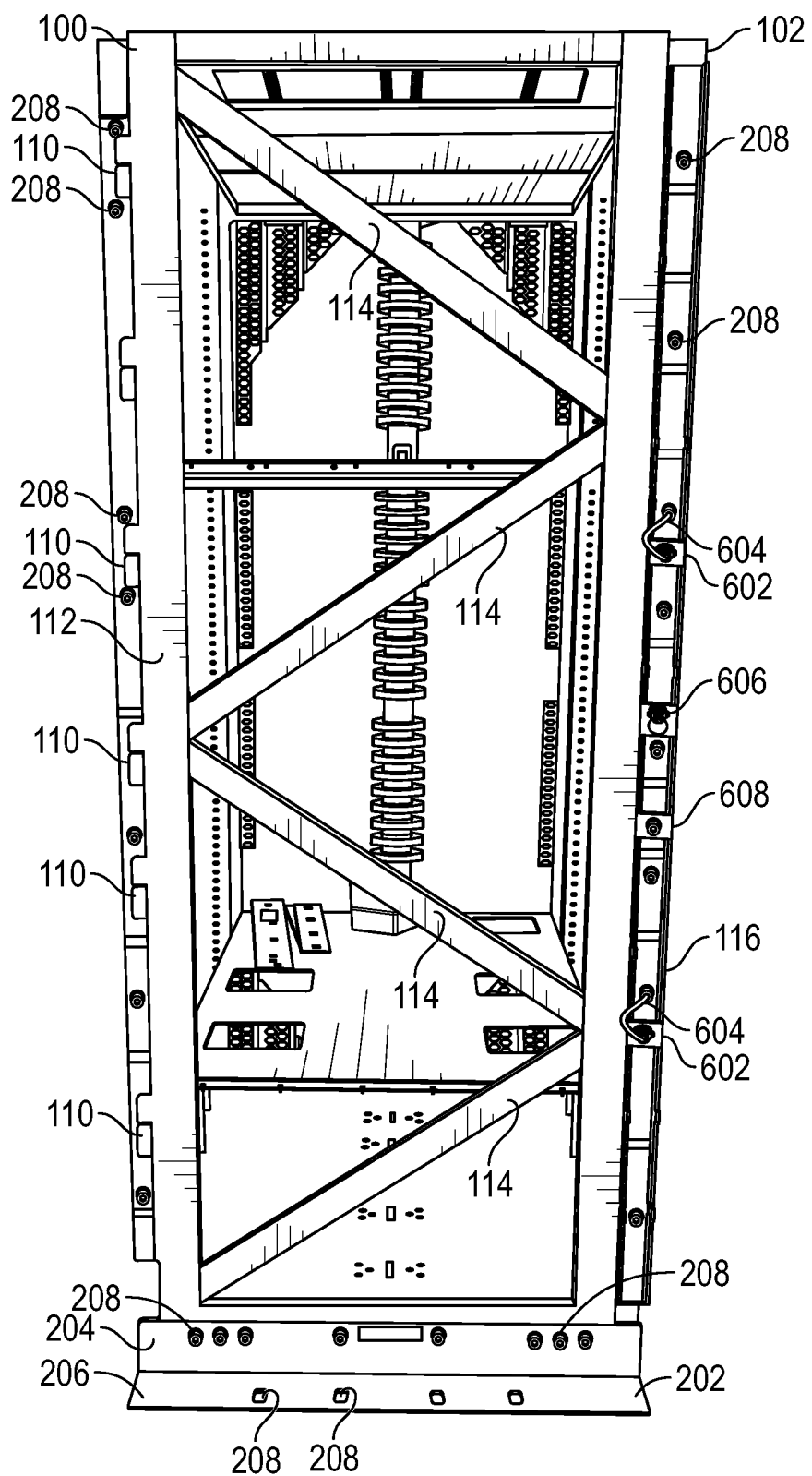
FIG. 2 is a front view illustrating the embodiment of a seismic brace mounted to the front of a computer rack of FIG. 1.

FIG. 2 is a front view illustrating seismic brace 100 mounted to the front of computer rack 102 of FIG. 1. In FIG. 2, an L-shaped anchor bracket 202 connects seismic brace 100 and computer rack 102 to floor 104, which works to resist the toppling of rack 102 due to, e.g., forces created by a seismic event. Anchor bracket 102 particularly works to increase the stability of rack 102 by countering toppling forces that would cause rack 102 to sway from left to right. Rack 102 is more susceptible to such forces since its footprint is relatively narrower than long. Anchor bracket 202 is fixed to floor 104 using bolts 208 through a horizontal flange 206 and is fixed to brace 100 and to rack 102 using bolts 208 through a vertical flange 206.

In an embodiment, an additional anchor bracket may be used to further increase the stability of rack 102 against fore/aft toppling forces by fixing rear face 108 of computer rack 102 to floor 104. In embodiments, the method of fixing anchor bracket 202 to floor 104 may vary depending on the construction of the data center floor (i.e., a raised floor versus a non-raised floor).

Figure 3:
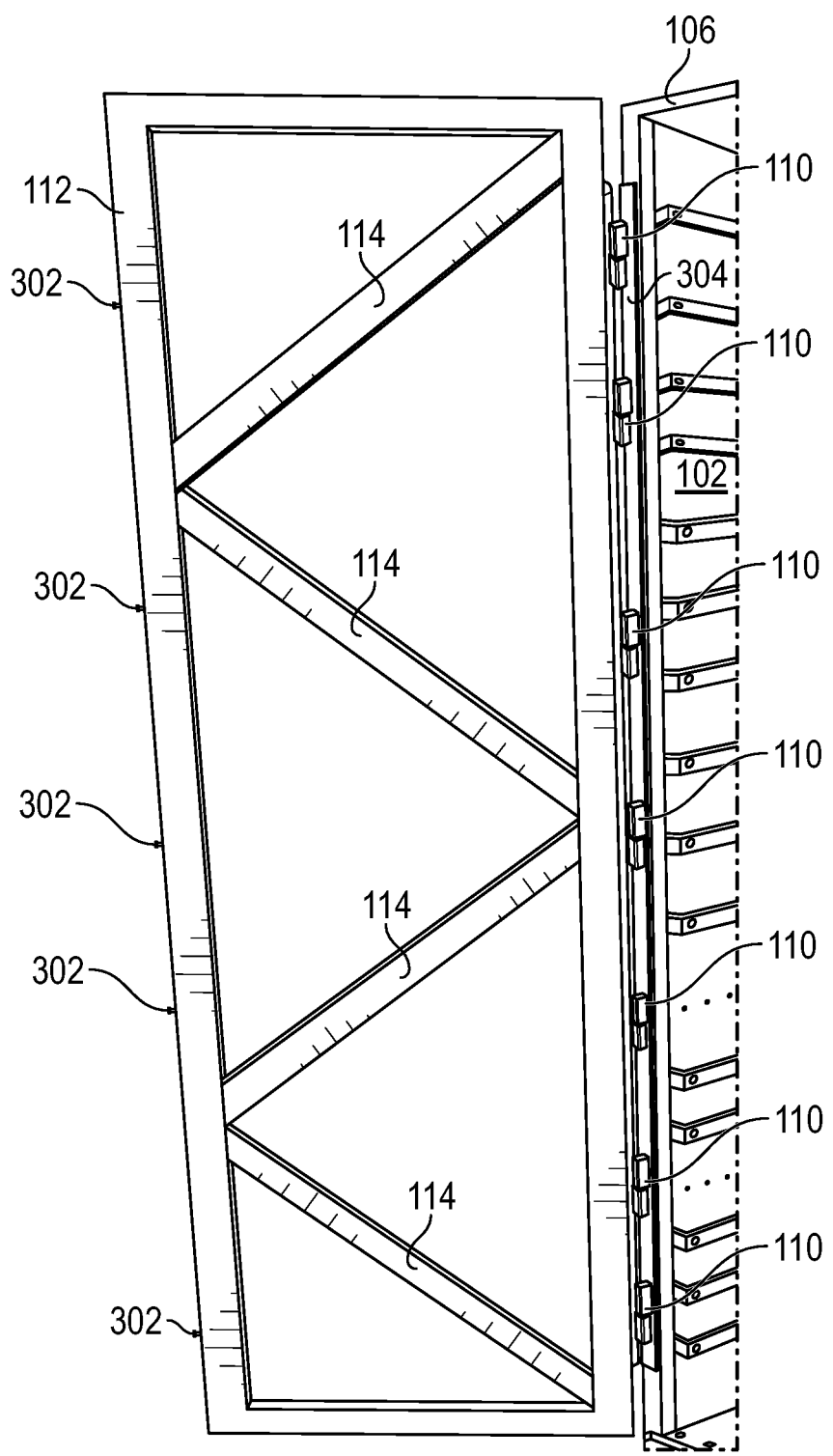
FIG. 3 is a perspective view illustrating aspects of an embodiment of a seismic brace.

FIG. 3 is a perspective view illustrating aspects of seismic brace 100 mounted to the left side of front face 106 of computer rack 102. FIG. 3 illustrates that brace 100 includes hinge plate 304, which is a stiffening element bolted to front face 106. Hinges 110 are attached to hinge plate 304, which is bolted to rack face 106. In an embodiment, hinges 110 may be bolted directly to face 106. FIG. 3 further illustrates that brace 100 includes captive elements 302, which are the elements of latch 116 that interlock with receiving elements of latch 116 on the right side of face 106. In the embodiment of FIG. 3, captive elements 302 are stubs, each stub including a shank connecting a relatively larger head to frame 112.

Figure 4:
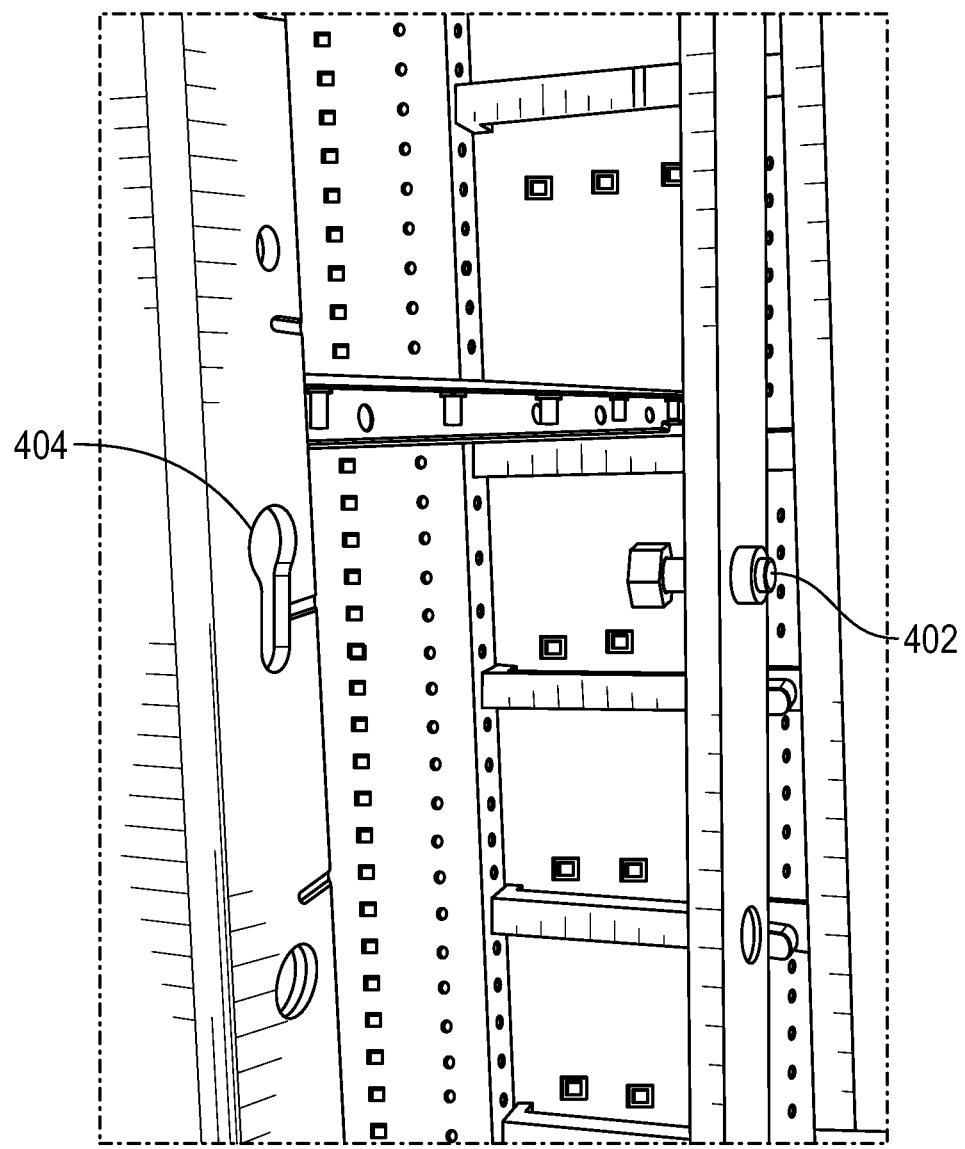
FIG. 4 is a side view illustrating aspects of an embodiment of a seismic brace.

FIG. 4 illustrates an aspect of mounting hinge plate 304 to front face 106. Base rack 102 may be equipped with a plurality of key hole slots 404. In the embodiment, hinge plate 304 is provided with corresponding holes, each for receiving a T-pin 402. T-pins 402 may then be inserted into the corresponding key hole slot 404 for holding hinge plate 304 in position while other bolts 208 are used to more securely fix hinge plate 304 in place. Latch 116 may be similarly positioned and fixed to rack 102 on the right side of face 106.

Figure 5:
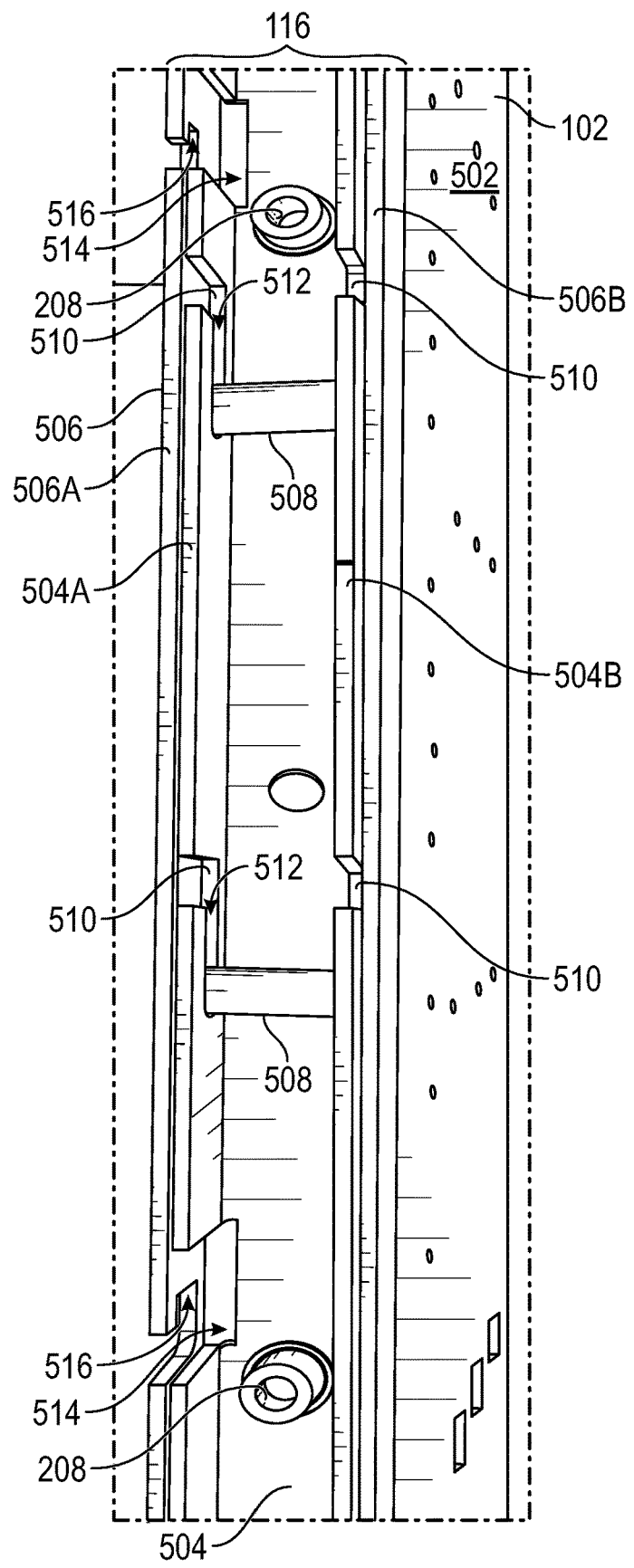
FIG. 5 is a perspective view illustrating aspects of an embodiment of a sliding latch.

FIG. 5 is a perspective view illustrating aspects of latch 116 of seismic brace 100 mounted to face 106 on the right side 502 of computer rack 102. Latch 116 includes an inner, fixed latch element 504 and an outer, sliding latch element 506. Fixed latch element 504 includes a left flange 504A and a right flange 504B. Latch element 504 is fixed to face 106 using bolts 208. Thus, latch element 504 is rigidly attached to computer rack 102. Flanges 504A, 504B of fixed latch element 504 include horizontal entry slots 510, which lead to vertical guide slots 512. Sliding latch element 506 includes a left sliding flange 506A and a right sliding flange 506B, which bookend fixed latch element 504. Left and right sliding flanges 506A, 506B are connected by slider guide elements (or slider guide rods) 508. Slider guide rods 508 join sliding flanges 506A, 506B together resulting in flanges 506A, 506B moving as one unit. Slider guide rods 508 move vertically within guide slots 512 allowing sliding flanges 506A, 506B to move up to an open position and down to a closed position.

Fixed latch element 504 includes captive element openings (or "stub" openings) 514. When sliding latch element 506 is up, in the open position, stub openings 514 are clear to receive stubs 302 when frame 112 is pivoted against face 106 of rack 102. Sliding flange 506A of sliding latch element 506 includes captive element capture slots (or "stub capture slots") 516. When sliding latch element 506 is down, in the closed position, the edges of stub capture slots 516 prevent stubs 302 from escaping stub openings 514. Thus, stub openings 514 and stub capture slots 516 cooperate to retain stubs 302. The retention of stubs 302 is described further with respect to FIG. 12 and FIG. 13.

Fixed latch element 504, being bolted to face 106 adds rigidity and strength to the right side of face 106 much like hinge plate 304 adds rigidity and strength to the left side of face 106. Fixed flanges 504A, 504B augment the strength of the right side of face 106. Sliding flanges 506A, 506B, which are connected to fixed latch element 504 through slots 512, further augment the strength and rigidity of the right side of face 106.

In an embodiment, fixed latch element 504 may have only one flange, e.g., fixed flange 504A with entry slots 510, guide slots 512 and stub openings 514. In the embodiment, slider guide rods 508 may be considerable shorter so that sliding flanges 506A, 506B sandwich fixed flange 504A between them.

In an embodiment, fixed latch element 504 may have only one flange, e.g., fixed flange 504A with entry slots 510, guide slots 512 and stub openings 514, and sliding latch element 506 may have only one flange, e.g., sliding flange 506A, with stub capture slots 516. In the embodiment, slider guide rods 508 are modified so that, instead of extending to connect to another flange, slider guide rods 508 extend through guide slots and are capped on the other side, the cap preventing slider guide rods 508 from being pulled out of guide slots 512.

In an embodiment, guide slots 512 may be machined into fixed flange 504A without including entry slots 510. In the embodiment, one or both sliding flanges may be bolted to the one or both fixed flanges through the machined guide slots.

Figure 6:
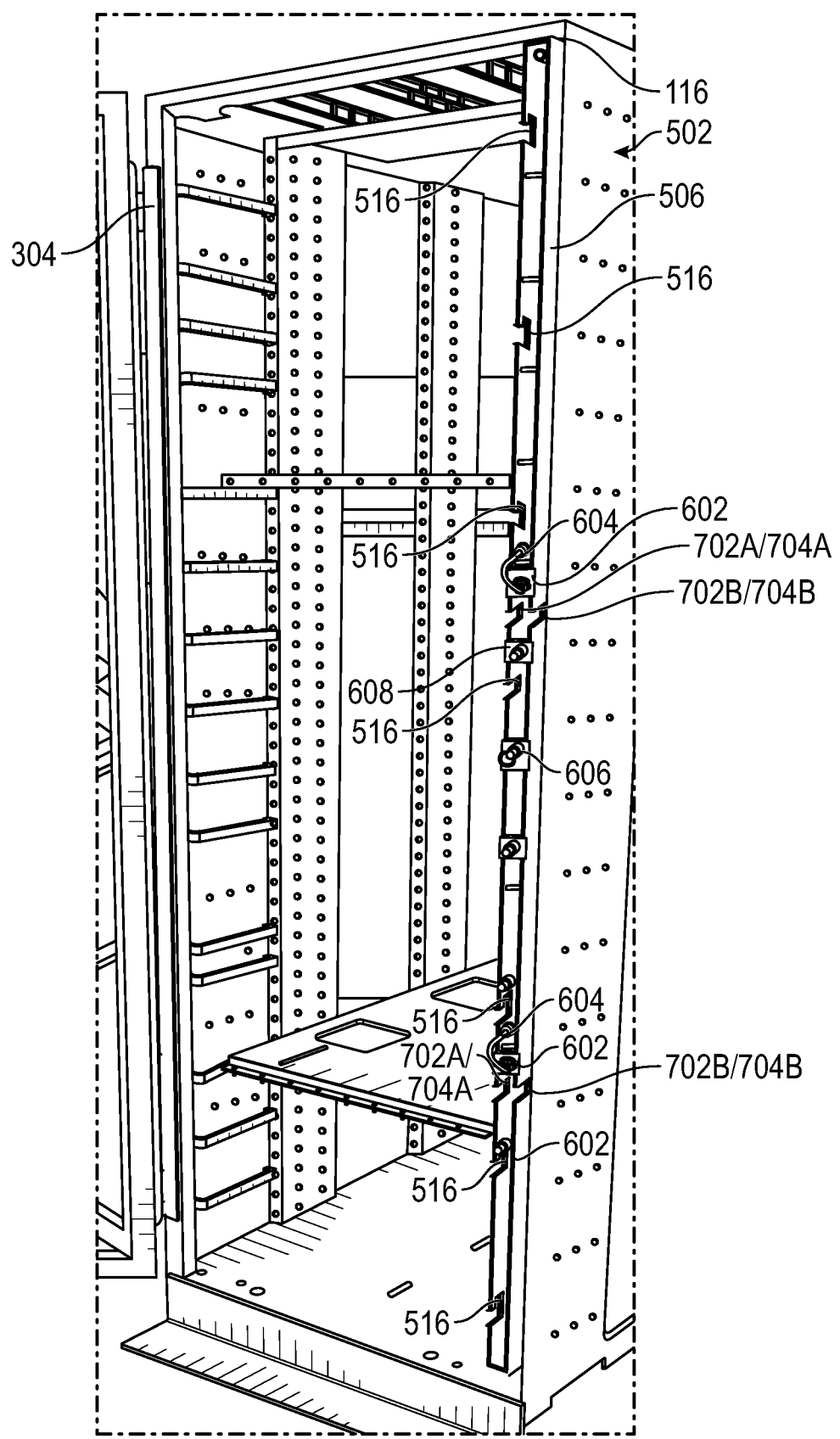
FIG. 6 is a perspective view illustrating aspects of an embodiment of a sliding latch.
Figure 7:
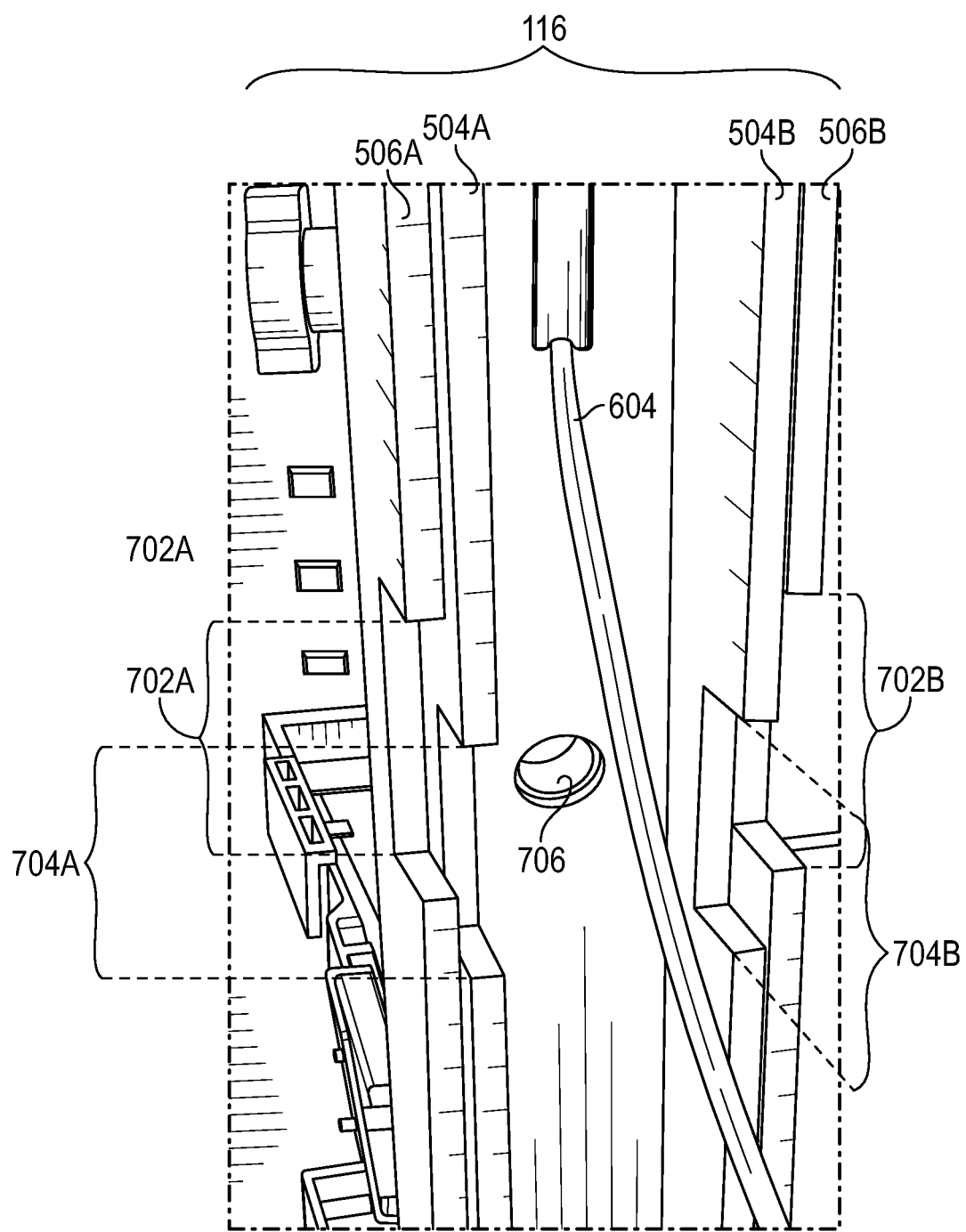
FIG. 7 is a perspective view illustrating aspects of an embodiment of a sliding latch.
Figure 8A:
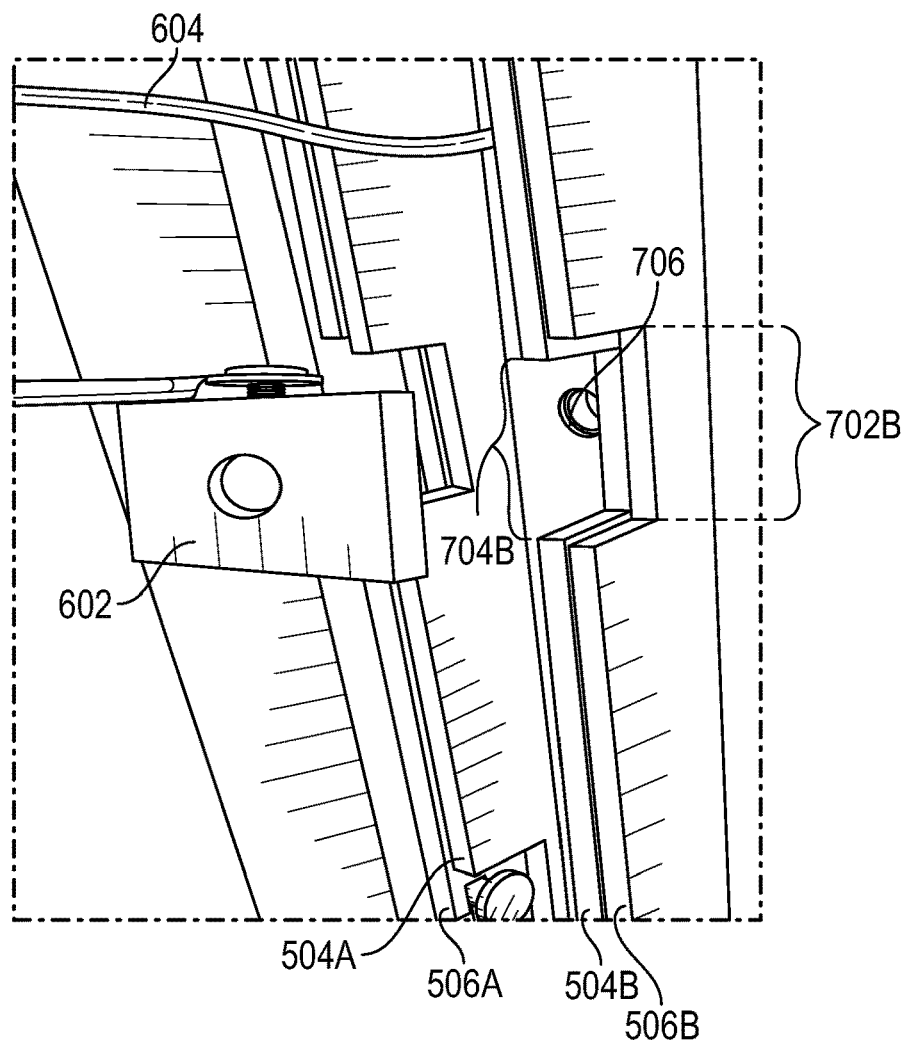
FIG. 8A is a perspective view illustrating aspects of an embodiment of a sliding latch.
Figure 8B:
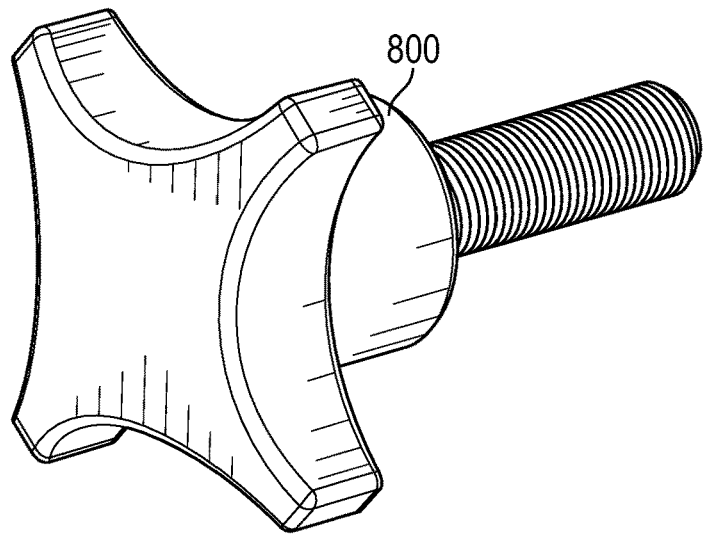
FIG. 8B is a perspective view illustrating aspects of an embodiment of a sliding latch.

FIG. 6 is a perspective view illustrating aspects of latch 116. In FIG. 6, latch 116 includes locking blocks 602 attached by lanyards 604 to fixed latch element 504. Locking blocks 602 are shown in an unlocked configuration—displaced from being within locking slots 702A/702B and 702B/704b (FIG. 7 and FIG. 8A provide more detail regarding how locking blocks 602 fit within locking slots 702A/702B and 702B/704b). A knurled knob 608 (depicted in more detail in FIG. 10) and a spring plunger 606 (depicted in more detail in FIG. 9) are provided on sliding latch element 506. Knurled knob 608 may be used to raise sliding latch element 506 to the open position, at which time the plunger of spring plunger 606 may engage a hole in fixed latch element 504 to keep sliding latch element 506 up, in the open position. FIG. 6 further illustrates that stub openings 514 are configured along latch 116 in positions to receive stubs 302 when frame 112 is pivoted closed (See FIG. 3).

FIG. 7 is a perspective view illustrating aspects of latch 116. FIG. 7 depicts details of a lock for preventing sliding latch element 506 from moving with respect to fixed latch element 504 and thereby keeping latch 116 closed. In FIG. 7, fixed flanges 504A, 504B are provided with locking slots 704A, 704B, respectively, and sliding flanges 506A, 506B are provided with locking slots 702A, 702B, respectively. A through hole 706 is provided in fixed flange 504. In FIG. 7, sliding latch element 506 is shown in the raised, or open, position and locking slots 702A, 702B are not aligned with locking slots 704A, 704B.

FIG. 8A depicts further details of a lock for keeping latch 116 closed by preventing sliding latch element 506 from moving with respect to fixed latch element 504. In FIG. 8A, sliding latch element 506 is shown in the lowered, or closed position and locking slots 702A, 702B are now aligned with locking slots 704A, 704B. Thus, locking block 602 may be positioned within locking slots 702A, 702B and 704A, 704B and fixed there with a retaining bolt 800 (FIG. 8B) through locking block 602 and into through hole 706 and engaging threads in rack face 106. The interference between locking block 602 and locking slots 702A, 702B and 704A, 704B prevents sliding latch element 506 from moving with respect to fixed latch element 504.

Figure 9:
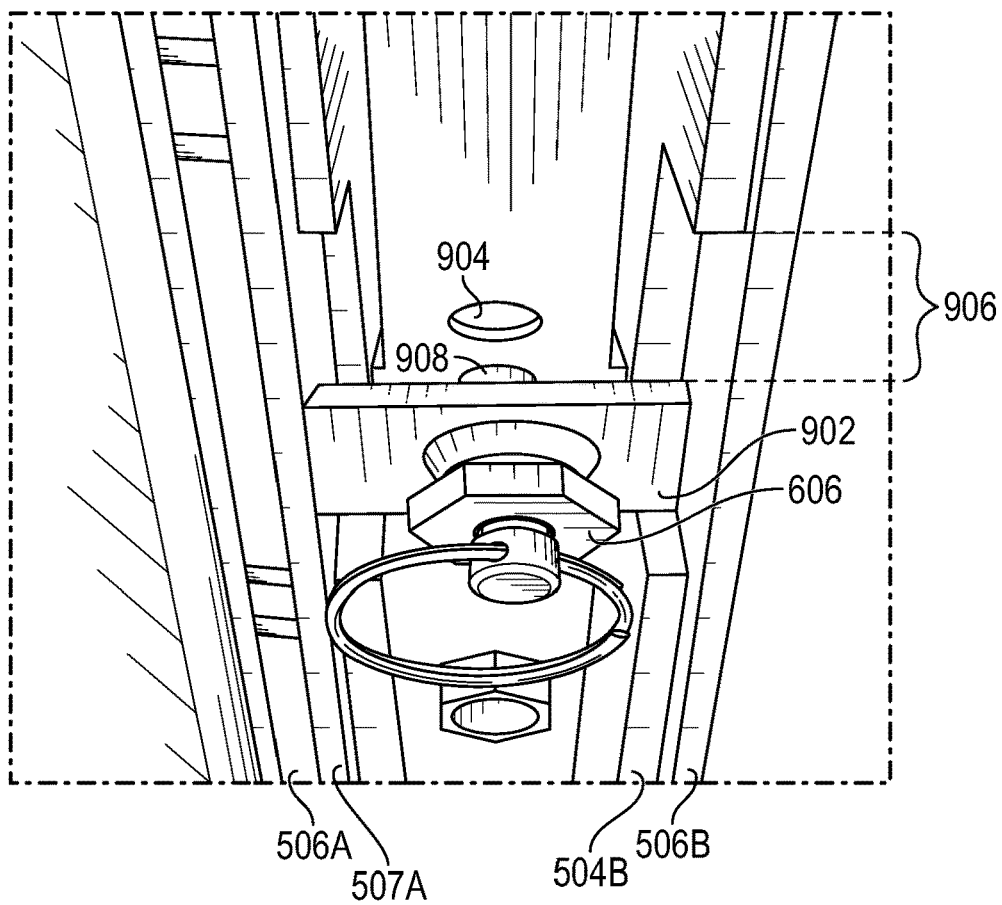
FIG. 9 is a perspective view illustrating aspects of an embodiment of a sliding latch.

FIG. 9 is a perspective view illustrating aspects of latch 116 with sliding flanges 506A, 506B down, in the closed position. In FIG. 9, spring plunger 606 is attached to a plunger bar 902, which connects sliding flanges 506A, 506B. In the closed position, plunger bar 902 rests at the bottom of plunger bar clearance slots 906 provided in sliding flanges 506A, 506B. In this down, or closed position, a plunger 908 of spring plunger 606 is not aligned with a plunger receiver hole 904.

Figure 10:
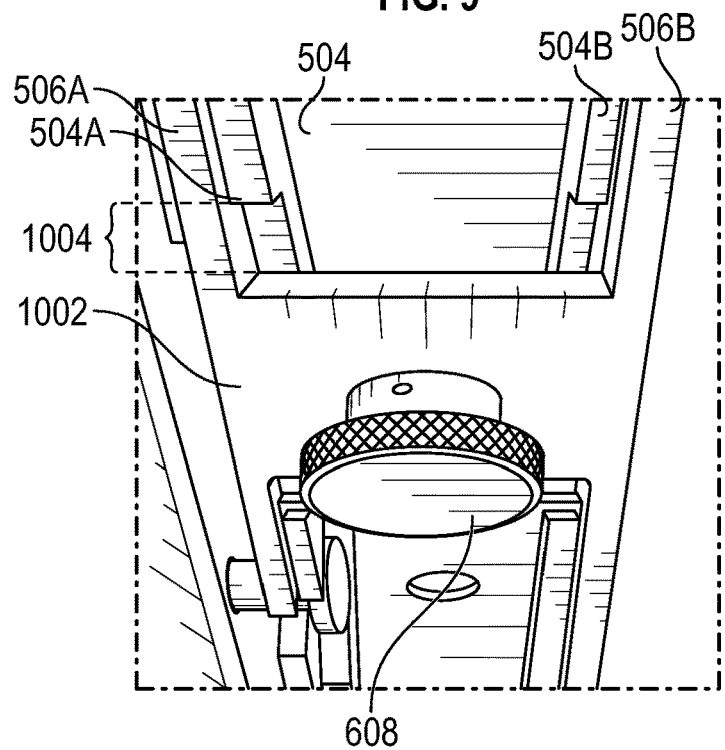
FIG. 10 is a perspective view illustrating aspects of an embodiment of a sliding latch.

FIG. 10 is a perspective view illustrating aspects of latch 116 with sliding flanges 506A, 506B down, in the closed position. FIG. 10 depicts knurled knob 608 connected to a knurled knob bar 1002, which in turn is connected between sliding flanges 506A, 506B. Knurled knob clearance slots 1004 are provided in sliding flanges 504A, 504B and indicate how much knurled knob 608 may be raised to bring sliding flanges 504A, 504B to the open position.

Figure 11:
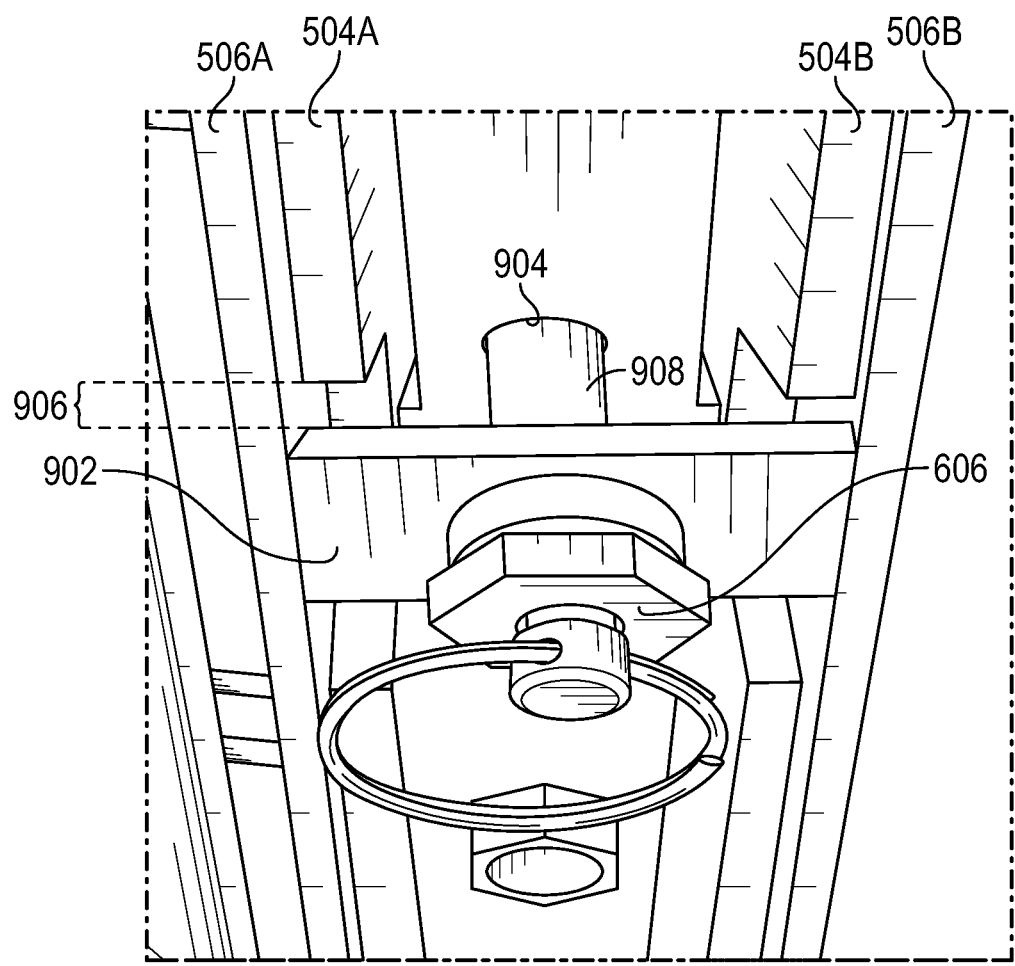
FIG. 11 is a perspective view illustrating aspects of an embodiment of a sliding latch.

FIG. 11 illustrates spring plunger 606 keeping sliding flanges 506A, 506B up, in the open position. In FIG. 11, sliding flanges 506A, 506B have been raised, e.g., by raising knurled knob 608, causing plunger bar 902 to rise within plunger bar clearance slots 906 until plunger end 908 aligned with and entered plunger receive hole 904. Spring plunger 606 will keep sliding latch element 506 in this position until the ring of spring plunger is pulled and plunger end 908 disengages from plunger receive 904.

Figure 12:
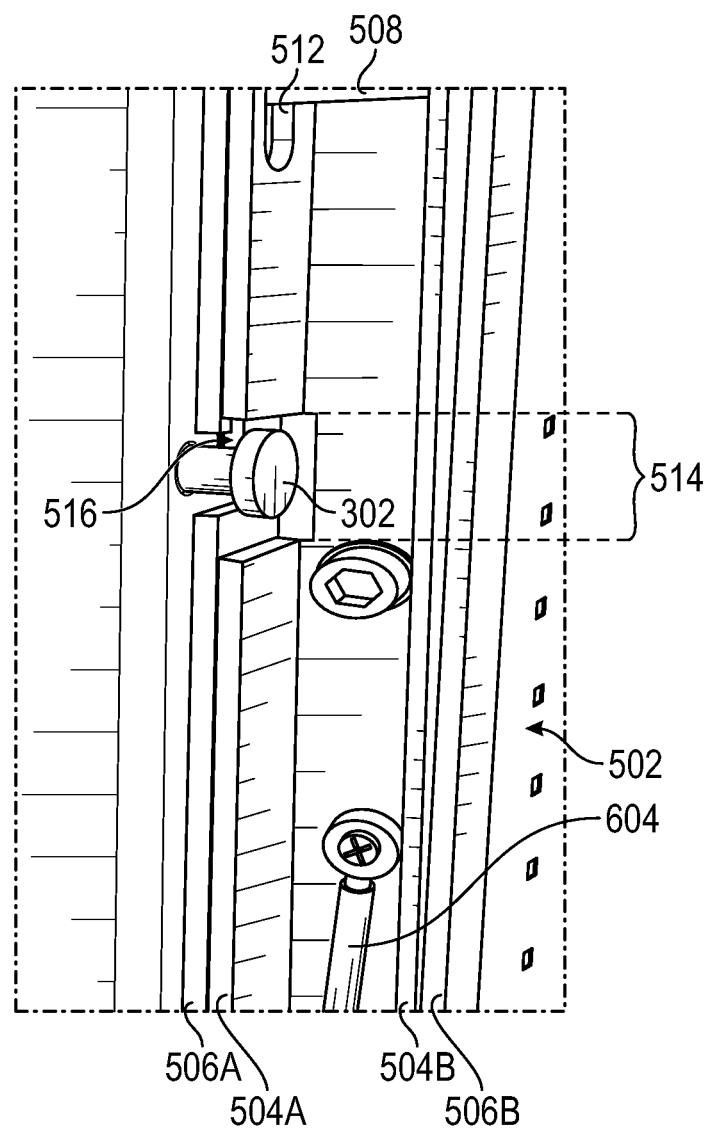
FIG. 12 is a perspective view illustrating aspects of an embodiment of a sliding latch.

FIG. 12 is a perspective view illustrating aspects of latch 116. In FIG. 12, sliding latch element 506 is shown raised, in the open position, and frame 112 is shown closed, with an exemplary stub 302 being received by a corresponding stub opening 514 of fixed latch element 504. With latch element 506 raised, in the open position, stub capture slot 516 (indicated with an arrow pointing to the gap between stub 302 and flange 506A) does not prevent stub 302 from entering or leaving stub opening 514 as frame 112 swings open or shut. Capture slot 516 is shown in more detail in FIG. 5. FIG. 12 illustrates aspects of capture element 302 (or stub 302). In this embodiment, capture element 302 includes a head of a first diameter connected by a shank of a smaller diameter to frame 112. The head of stub 302 is depicted to be past sliding flange 506A and to be between the edges of stub opening 514. Stub opening 514 is dimensioned to receive the head of capture element 302. As such, stub opening 514 prevents the head of stub 302 from moving up or down appreciably with respect to fixed latch element 504, but does not does not prevent stub 302 from entering or leaving stub opening 514 when frame 112 swings open or shut. In contrast, stub capture slot 516 of sliding latch element 506 is dimensioned to receive the shank of stub 302, but is not large enough to receive the head of stub 302. In the raised position of FIG. 12, guide rod 508 is shown raised with respect to guide slot 512.

Figure 13:
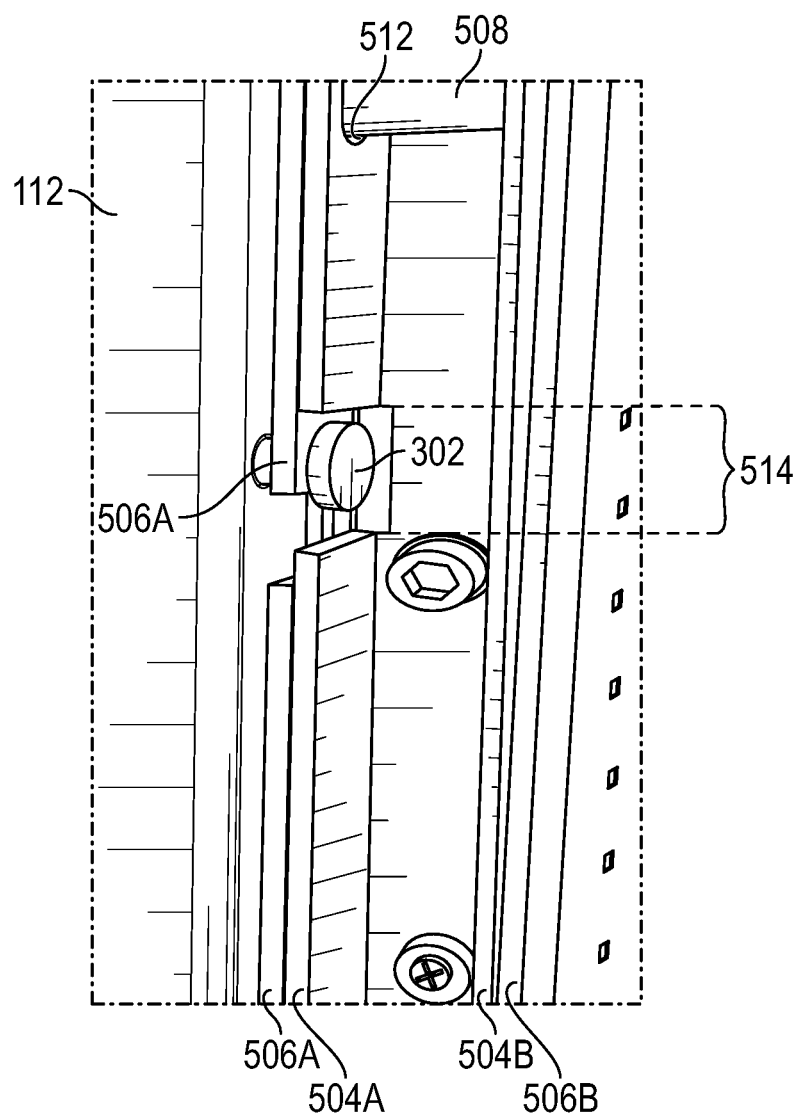
FIG. 13 is a perspective view illustrating aspects of an embodiment of a sliding latch.

FIG. 13 is a perspective view illustrating aspects of latch 116. In FIG. 13, sliding latch element 506 is shown lowered, in the closed position. When sliding latch element 506 moved from the open to the closed position, capture slot 516 moved down with sliding flange 506A and encompassed the shank of stub 302 within capture slot 516. Thus, in FIG. 13, stub 302 is captured by the combined elements of fixed flange 504A (the edges of stub opening 514) and sliding flange 506A (the edges of stub capture slot 516). Stub 302 cannot pivot with frame 112 away from fixed latch element 504 because its shank is retained within capture slot 516. Stub 302 cannot pull left and through capture slot 516 because its head is too large to fit through capture slot 516. Thus, an aspect of brace 100 is that forces that would cause fixed latch element 504 and sliding latch element 506 to bow away from frame 112 (e.g., such as compressive forces forcing the top of rack 102 toward floor 104) are resisted by the heads of stubs 302 working to retain sliding latch element 506 in place and parallel to the edge of frame 112. In addition, the bow-resisting force of stubs 302 is transferred through guide rods 508 to sliding flange 506B, further stiffening latch 116.

Figure 14:
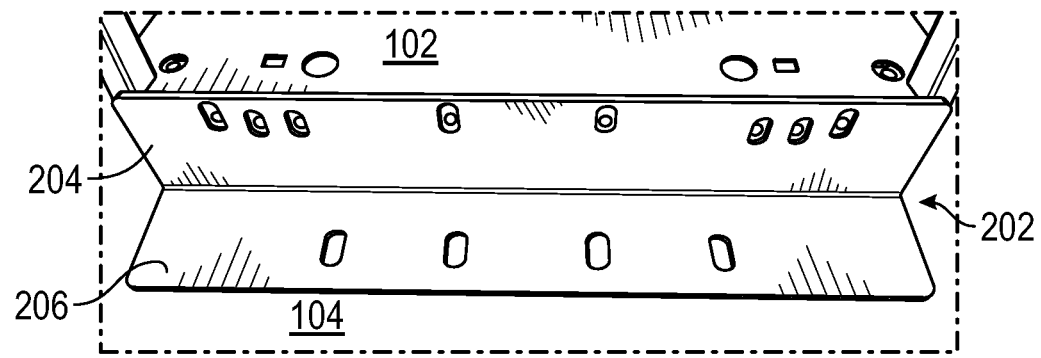
FIG. 14 is a perspective view illustrating aspects of an embodiment of a seismic brace.

FIG. 14 is a perspective view illustrating aspects of an embodiment of a seismic brace, i.e., L-shaped anchor bracket 202. In FIG. 14, vertical flange 204 of anchor bracket 202 is shown in position to be bolted (or otherwise fastened) to the bottom of front face 106 of computer rack 102. Horizontal flange 206 is shown in position to be bolted (or otherwise fastened) to floor 104 (although floor 104 has not yet been appropriately prepared for receiving such bolts). One will understand that there are numerous acceptable ways in which a bracket may be fastened to an external structure such as a data center floor.

Figure 15:
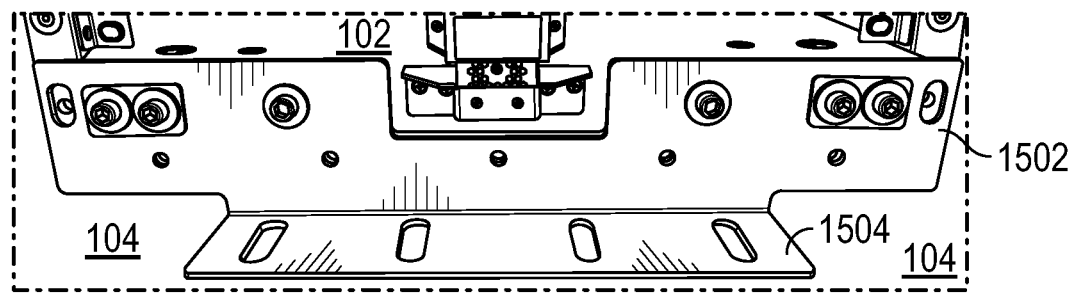
FIG. 15 is a perspective view illustrating aspects of an embodiment of a seismic brace.

FIG. 15 is a perspective view illustrating aspects of an embodiment of a seismic brace, i.e., L-shaped anchor bracket 1500. In FIG. 15, anchor bracket 1500 includes a vertical flange 1502, which is shown bolted to the bottom of rear face 108 of computer rack 102. Anchor bracket 1500 includes a horizontal flange 1504, which is shown in position to be bolted (or otherwise fastened) to floor 104 (although floor 104 has not yet been appropriately prepared for receiving such bolts). FIG. 15 has a notch in vertical flange 1502 that accommodates a protrusion from computer rack 102. Thus, FIG. 15 illustrates that the dimensions of braces and anchor brackets of embodiments may be modified to accommodate unusual rack features, or rack contents, without departing from the teachings of this disclosure. FIG. 15 also shows a series of threaded holes along the bottom of vertical flange 1502 which may be used to bolt a seismic brace, e.g., seismic brace 1500 (FIG. 15), to anchor bracket 1500 and computer rack 102.

In FIG. 14 and FIG. 15, anchor bracket 202 is shown in position to connect the front of rack 102 to floor 104 and anchor bracket 1500 is shown in position to connect the rear of rack 102 to floor 104. This use of front and rear anchor brackets illustrates that the use of dual anchor brackets (one at both front and rear of the case), in securing both the front of the rack and the rear of the rack to the floor, will be more effective in resisting toppling forces in the fore/aft direction than just a single anchor bracket. For example, with a single front anchor bracket, forces that would push the top of the computer rack forward are resisted by the bending strength of the anchor bracket, which may be insufficient to prevent the rack from being toppled.

Figure 16:
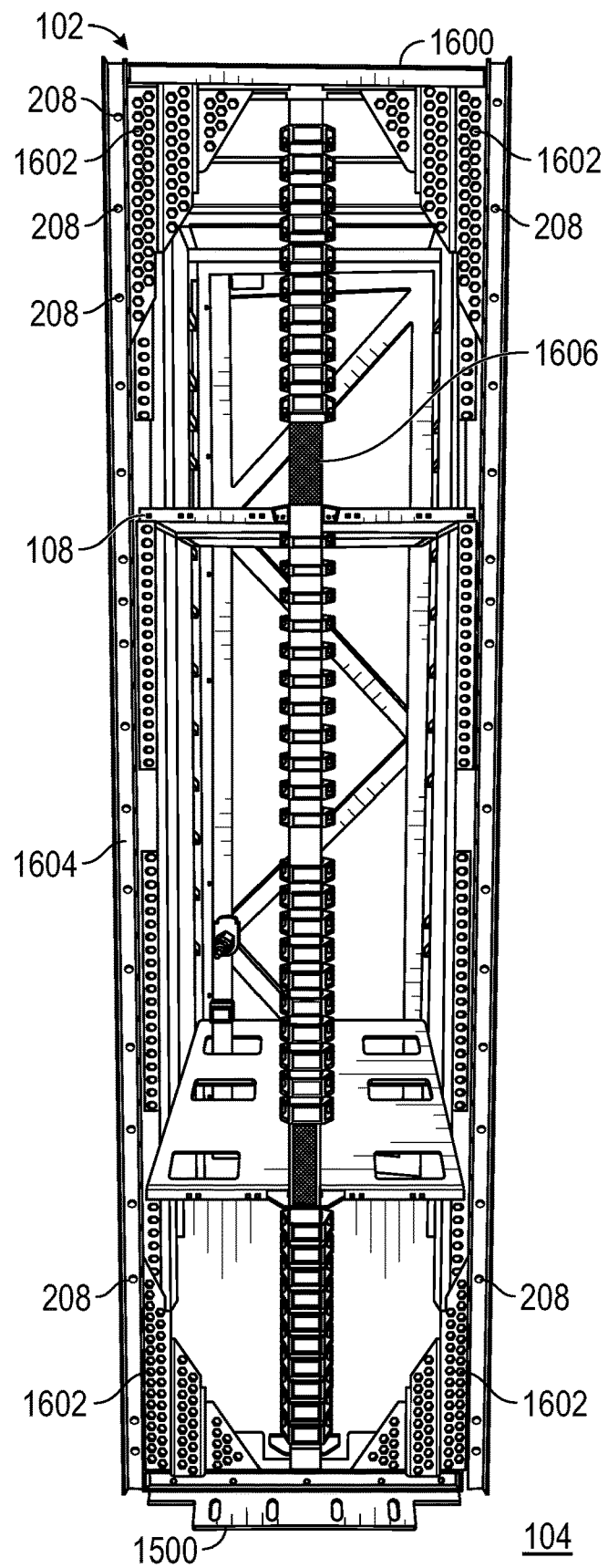
FIG. 16 is a perspective view illustrating aspects of an embodiment of a seismic brace.
Figure 17:
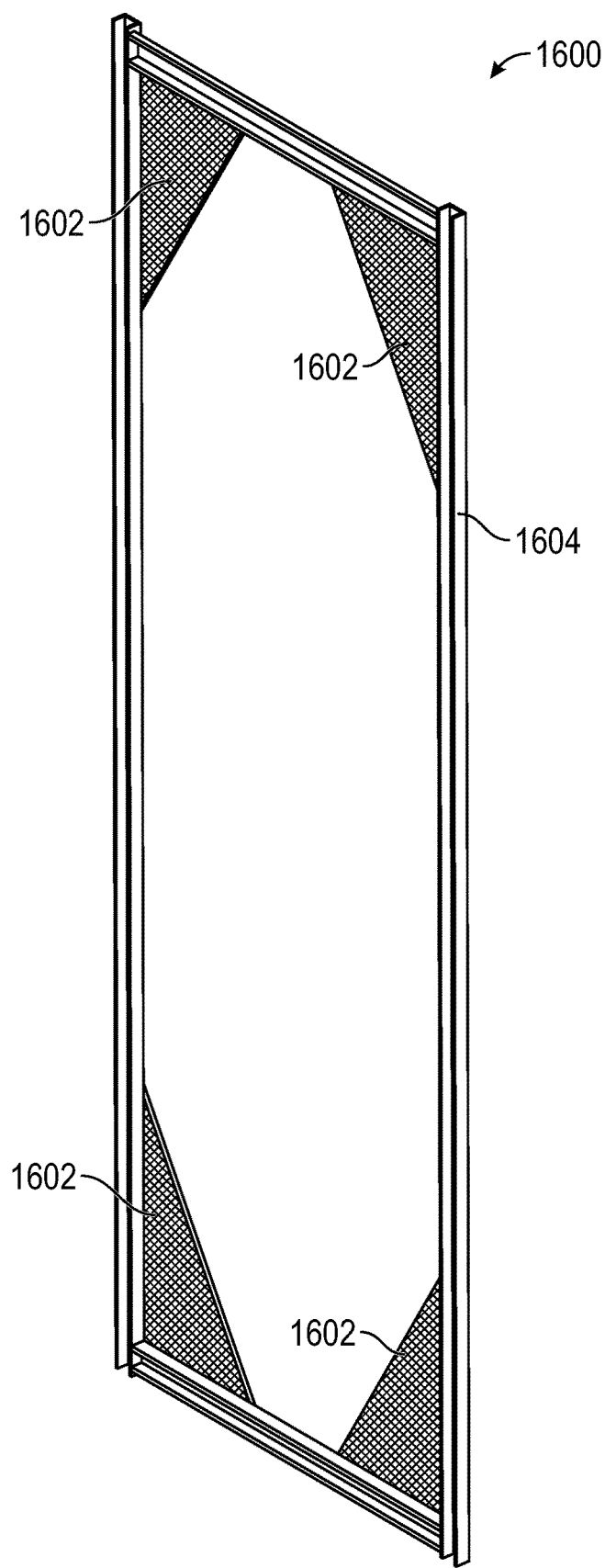
FIG. 17 is a perspective view illustrating aspects of an embodiment of a seismic brace.

FIG. 16 is a front view illustrating aspects of an embodiment of seismic brace 1600. FIG. 16 illustrates seismic brace 1600 attached to rear face 108 of computer rack 102 using bolts 208. Seismic rack 1600 may also be bolted to anchor bracket 1500 as discussed previously. Seismic brace 1600 includes perforated corner gussets 1602 in each corner of a frame 1604. With frame 1604 stiffened by perforated corner gussets 1602, the center may be left open to accommodate features of computer rack 102, which in this case includes a rack-mounted bus bar 1606. FIG. 16 illustrates a seismic brace 1600 that may be used at the front or rear of a computer rack when access to the equipment is not required on a regular basis. FIG. 16 further illustrates that, for applications where the rack or computer equipment extends beyond the rack (such as rack-mounted bus bars), the stiffening structure inside the brace framework may be modified or adapted to be compatible with the equipment. In other words, perforated gussets 1602 are an example of how a brace may be modified to allow room for rack contents or features (such as rack bus bars) to extend outside the plane of brace 1600. FIG. 17 is a perspective view illustrating aspects of the seismic bracket 1600.

Figure 18A:
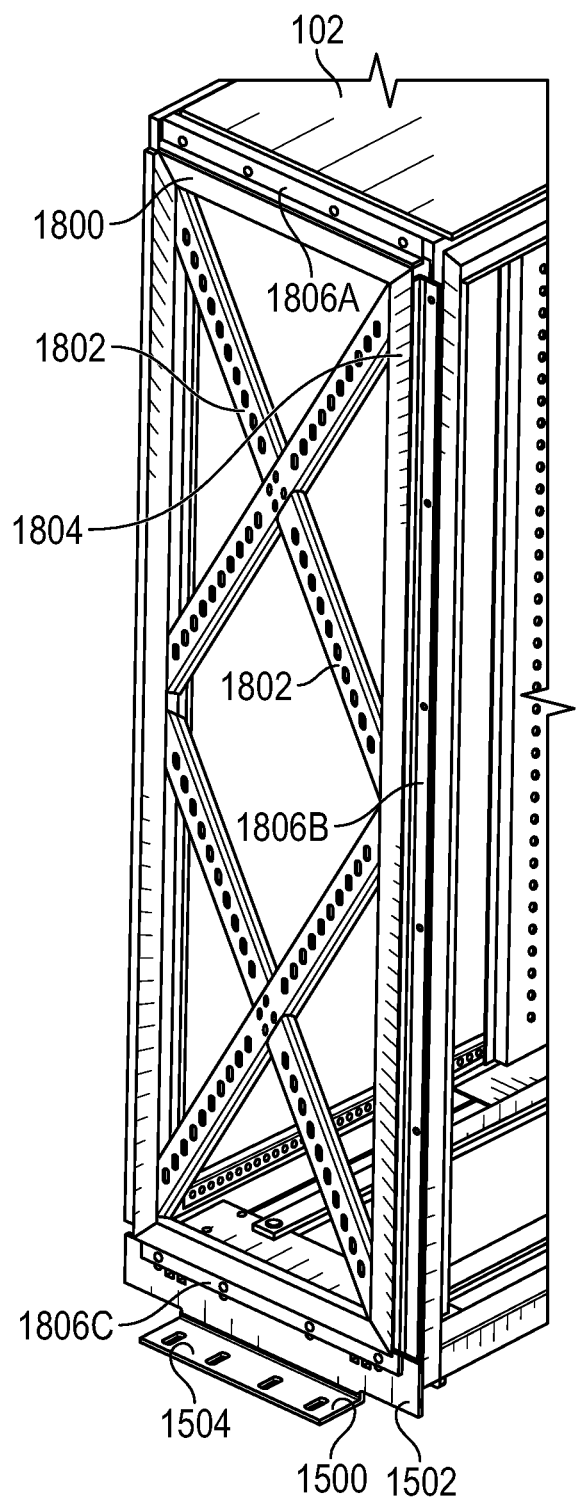
FIG. 18A is a perspective view illustrating aspects of an embodiment of a seismic brace.
Figure 18B:
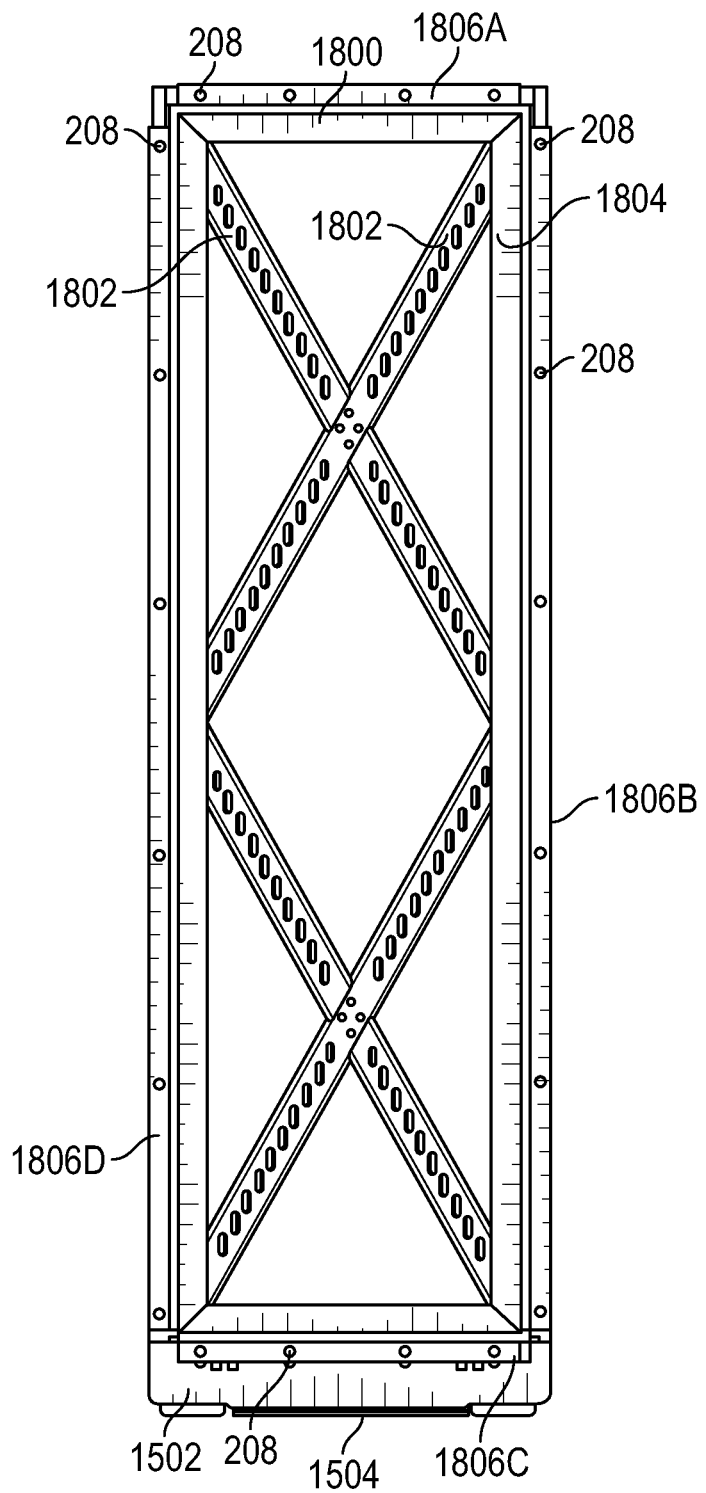
FIG. 18B is a front view illustrating aspects of an embodiment of a seismic brace.

FIG. 18A and FIG. 18B are a perspective view and a front view illustrating aspects of an embodiment of a seismic brace 1800. Seismic brace 1800 is a further embodiment of a seismic brace that may be used at the front or rear of a computer rack where access to the equipment is not required on a regular basis. In addition, seismic brace 1800 is an embodiment of a seismic brace that may be used for applications where neither rack 102 nor the computer equipment contained by the rack extend beyond the face of rack 102. Seismic brace 1800 includes braces 1802 that may extend within a frame 1804 arbitrarily over the entire plane of the face and may use typical construction techniques and materials, such as the C-channel construction illustrated in FIGS. 18A and 18B. In FIG. 18A and FIG. 18B, seismic brace 1800 is secured to rack 102 using a series of bolts 208 through flanges 1806A, 1806B, 1806C, 1806D of frame 1804.

In an embodiment, a seismic brace may add strength and rigidity to a computer rack by joining adjacent sides of a rectangular face, e.g., a left side and a top side or a bottom side, instead of opposing sides, such as a left side and a right side of a computer rack.

It is understood that any specific order or hierarchy of steps in the processes disclosed is an illustration of approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

We claim:

1. An apparatus comprising:
   a first brace configured to be mounted by at least one hinge to a first side of a rack face;
   a latch including:
      a plurality of capture elements disposed on a second side of the first brace;
      a first latch element configured to be mounted to a second side of the rack face and including:
         a first lock slot,
         a plurality of first capture slots configured to receive the plurality of capture elements, and
         a plurality of guide slots;
      a second latch element configured to be movable with respect to the first latch element between an open position and a closed position, the second latch element including:
         a second lock slot aligned with the first lock slot when the second latch element is in the closed position,
         a plurality of second capture slots configured to receive the plurality of capture elements, and
         a plurality of guide elements configured to be received by the plurality of guide slots; and
      a locking block that locks the second latch element in the closed position when positioned within the first and second lock slots;
   wherein the plurality of guide elements move within the plurality of guide slots when the second latch element is moved between the open position and the closed position, and wherein the plurality of capture elements are captured by the plurality of first and second capture slots when the second latch element is in the closed position.

2. The apparatus of claim 1, wherein each of the plurality of capture elements includes a head and a shank, the shank connecting the first brace to the head and configured to be received by one of the second capture slots, and the head being configured to be too large to pass through one of the second capture slots.

3. The apparatus of claim 2, wherein the plurality of capture elements are captured by the plurality of first and second capture slots includes:
   one first capture slot and one second capture slots cooperating to limit radial movement of the shank, and
   the head and brace being too large to pass through the second capture slot and thereby limiting axial movement of the capture element.

4. The apparatus of claim 1, wherein the first brace includes a frame coupled to the at least one hinge, the frame including the first side of the first brace and the second side of the first brace.

5. The apparatus of claim 4, wherein the rack face and the frame are rectangular and first side of the first brace is parallel to the second side of the first brace.

6. The apparatus of claim 1 further comprising a second brace configured to connect the rack to an external structure such that when connected to the rack and external structure the first brace and second brace resist movement of the rack with respect to the external structure.

7. The apparatus of claim 1, wherein each guide slot further includes an entry slot configured to admit a guide element into the guide slot.

8. An apparatus comprising:
a first brace configured to be movably coupled to a rack along a first side of the first brace and a first side of the rack;
a latch including:
a plurality of capture elements attached to a second side of the first brace;
a first latch element configured to be mounted to a second side of the first frame rack and including:
a first lock slot,
a plurality of first capture slots configured to receive the plurality of capture elements, and
a plurality of guide slots;
a second latch element attached to the first latch element and movable with respect to the first latch element between a first position and a second position, the second latch element including:
a second lock slot aligned with the first lock slot when the second latch element is in the second position,
a plurality of second capture slots configured to receive the plurality of capture elements, and
a plurality of guide elements configured to be received by the plurality of guide slots; and
a locking block that locks the second latch element in the second position when positioned within the first and second lock slots;
wherein the plurality of guide elements move within the plurality of guide slots when the second latch element is moved between the first position and the second position,
wherein, when the second latch element is in the first position and the plurality of capture elements are within the plurality of first capture slots, the plurality of capture elements are removable from the first capture slot, and
wherein, when the second latch element is in the second position and the plurality of capture elements are received by the plurality of first capture slots and the plurality of second capture slots: the plurality of capture element are constrained to remain within the latch by the plurality of first capture slots, the plurality of second capture slots, and the first brace; and the first brace and latch couple the first side of the rack to the second side of the rack such that the first brace resists movement of the first side of the rack with respect to the second side of the rack.

9. The apparatus of claim 8, wherein each of the plurality of capture elements includes a head and a shank, the shank connecting the first brace to the head and configured to be received by one of the second capture slots, and the head being configured to be received by one of the first capture slots and be larger than the shank such that the head may not pass through the one of the second capture slots.

10. The apparatus of claim 9, wherein the plurality of capture elements are constrained to remain within the latch by the plurality of first capture slots and the plurality of second capture slots; and the first brace includes:
each corresponding pair of first and second capture slots cooperating to limit radial movement of the shank, and
the head and the first brace being too large to pass through the one of the second capture slots and cooperating to limit axial movement of the capture element.

11. The apparatus of claim 8, wherein the first brace includes a hinge plate movably coupled to the first side of the first brace using at least one hinge.

12. The apparatus of claim 8 further comprising a second brace configured to couple the rack to an external structure such that when coupled to the rack and external structure the first brace and second brace resist movement of the rack with respect to the external structure.

13. The apparatus of claim 8, wherein each guide slot further includes an entry slot configured to admit a guide element into the guide slot.

14. The apparatus of claim 8, wherein the rack and the first brace are rectangular and the first side of the first brace is parallel to the second side of the first brace.

15. An apparatus comprising:
a first brace configured to be movably coupled to a rack along a first side of the first brace and a first side of the rack;
a latch including:
a plurality of capture elements attached to a second side of the first brace;
a first latch element configured to be mounted to a second side of the rack and including:
first and second fixed rails extending perpendicularly from the face of the rack, the first fixed rail being parallel to the second fixed rail and positioned between the second fixed rail and the first brace,
a first lock slot in the first fixed rail and a second lock slot in the second fixed rail, the second lock slot parallel to the first lock slot in position and configuration,
a plurality of first capture slots provided in the first fixed rail and configured to receive the plurality of capture elements,
a first plurality of guide slots provided in the first fixed rail, and
a second plurality of guide slots provided in the second fixed rail, the second plurality of guide slots matching the first plurality of guide slots in position and configuration;
a second latch element attached to the first latch element and movable with respect to the first latch element between a first position and a second position, the second latch element including:
first and second slide-able rails parallel to the first and second fixed rails with the first and second fixed rails positioned between the first and second slide-able rails, the first slide-able rail being positioned between the first fixed rail and the first brace,
a third lock slot in the first slide-able rail and a fourth lock slot in the second slide-able rail, the fourth lock slot parallel to the third lock slot in position and configuration,
a plurality of second capture slots provided in the first slide-able rail and configured to receive the plurality of capture elements, and
a plurality of guide elements, each guide element positioned and configured to be received by one of the first plurality of guide slots and one of the second plurality of guide slots; and a locking block that locks the second latch element in the second position when positioned within the first, second, third, and fourth lock slots;

wherein the plurality of guide elements move within the first and second pluralities of guide slots when the second latch element is moved between the first position and the second position, wherein, when the second latch element is in the first position and the plurality of capture elements are within the plurality of first capture slots, the plurality of capture elements are removable from the first capture slots, and wherein, when the second latch element is in the second position and the plurality of capture elements are received by the plurality of first capture slots and the plurality of second capture slots: the plurality of capture element are constrained to remain within the latch by the plurality of first capture slots, the plurality of second capture slots, and the first brace and the first brace and latch couple the first side of the rack to the second side of the rack such that the first brace resists movement of the firsts side of the rack with respect to the second side of the rack.

\* \* \* \* \*